United States Patent
Lim et al.

(10) Patent No.: US 7,515,007 B2
(45) Date of Patent: Apr. 7, 2009

(54) INTEGRATED DIELECTRIC RESONATOR FILTER AND CLOCK EXTRACTION DEVICE USING THE SAME

(75) Inventors: Sang Kyu Lim, Daejeon (KR); Sang Soo Lee, Daejeon (KR); Hyun Woo Cho, Daejeon (KR); Je Soo Ko, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 12 days.

(21) Appl. No.: 11/441,655

(22) Filed: May 26, 2006

(65) Prior Publication Data
US 2007/0109060 A1   May 17, 2007

(30) Foreign Application Priority Data
Nov. 17, 2005   (KR) ................ 10-2005-0110182

(51) Int. Cl.
*H03B 5/30* (2006.01)
(52) U.S. Cl. ............ 331/154; 331/116 M; 331/107 DP; 331/107 SL; 333/219.1
(58) Field of Classification Search ........... 331/107 DP, 331/107 SL, 154, 116 M, 68; 333/219.1
See application file for complete search history.

(56) References Cited

U.S. PATENT DOCUMENTS 3,451,015 A * 6/1969 Heath ..................... 333/203
4,737,970 A   4/1988 Viola et al.

FOREIGN PATENT DOCUMENTS

KR     1019950000670 B1     1/1995

OTHER PUBLICATIONS

Electronics Letters, May 12, 1994, vol. 30, No. 10, pp. 799-800.
Electronics Letters, Apr. 23, 1992, vol. 28, No. 9, pp. 819-820.

* cited by examiner

*Primary Examiner*—Arnold Kinkead
(74) *Attorney, Agent, or Firm*—Blakely, Sokoloff, Taylor & Zafman LLP (57) ABSTRACT

Provided are an integrated dielectric resonator filter and a clock extraction device using the integrated dielectric resonator filter. The integrated dielectric resonator filter includes: a microwave substrate; a disc type dielectric resonator installed on the microwave substrate and having predetermined diameter and height; an input and output transmission line installed on both sides of the disc type dielectric resonator to transmit input and output signals; and a metal cover enclosing the disc type dielectric resonator to form a predetermined volume, opened toward the input and output transmission line, and closed in an orthogonal direction to the input and output transmission line.

4 Claims, 9 Drawing Sheets

INTEGRATED DIELECTRIC RESONATOR FILTER AND CLOCK EXTRACTION DEVICE USING THE SAME

CROSS-REFERENCE TO RELATED PATENT APPLICATION

This application claims the benefit of Korean Patent Application No. 10-2005-0110182, filed on Nov. 17, 2005, in the Korean Intellectual Property Office, the disclosure of which is incorporated herein in its entirety by reference.

BACKGROUND OF THE INVENTION

1. Field of the Invention

The present invention relates to a dielectric resonator filter adopted in an receiver for the ultrahigh optical transmission system and a clock extraction device using the same, and more particularly, to an electric filter extracting a clock signal from the received data to reproduce a clock signal in an optical receiver and an open-loop type clock extraction device using the same.

2. Description of the Related Art

Clock extraction devices are slightly differently constituted according to types of used transmission signals. In a case where NRZ signals are used, signals corresponding to clock frequencies do not exist. Thus, the clock extraction devices additionally include nonlinear circuit blocks to generate clock signal components. In a case where RZ signals including components of clock signals are used, the clock extraction devices don't need nonlinear circuit blocks.

Clock extraction devices for optical communication systems require electric filter blocks to extract high-quality clock signals and can be classified into closed-loop structure using phase-locked loops (PLLs) and open-loop structure using passive bandpass filters (BPFs).

The open-loop devices include simpler circuit structures and can be implemented more easily at a transmission speed of Gb/s or more as compared to the closed-loop devices. Also, in the open-loop devices, some different techniques have been adopted for the passive BPFs depending on transmission speeds of systems. SAW filter or tank circuit using lumped R, L, and C has been used at a transmission of Gb/s or less. Disc type dielectric resonator filter, which has high-Q value in microwave frequencies, has been used at a transmission of several Gb/s or more.

However, the disc type dielectric resonator filter has been manufactured in the form of independent module with the input and output coaxial connectors. Thus, the conventional disc type dielectric resonator filter is difficult to integrate with other electrical circuits, such as nonlinear circuits and clock amplifiers, in a clock extraction device. Nonlinear circuit blocks and clock amplifier blocks realized on a microwave substrate have been separately manufactured in the form of individual modules in which the input and output connectors are installed, too.

Accordingly, conventional dielectric resonator filters hinder open-loop clock extraction devices using dielectric resonator filters from being compact. Thus, these configurations using the individual modules increase total connection paths in the open-loop clock extraction devices. As a result, the signal loss increases.

Also, in a case of several Gb/s clock extraction devices using the conventional dielectric resonator filters, a plurality of undesired spurious pass bands exist in the vicinity of central frequencies of the conventional dielectric resonator filters that mean clock frequencies. Thus, additional BPFs are required to remove the undesired spurious pass bands.

SUMMARY OF THE INVENTION

The present invention provides a dielectric resonator filter, in which the input and output ports are realized by micro-strip transmission lines, and an open-loop type clock extraction device using the dielectric resonator filter.

According to an aspect of the present invention, there is provided a dielectric resonator filter including: a microwave substrate; a disc type dielectric resonator installed on the microwave substrate and having predetermined diameter and height; an input and output transmission line installed on both sides of the disc type dielectric resonator to transmit input and output signals; and a metal cover enclosing the disc type dielectric resonator to form a predetermined volume, opened toward the input and output transmission line, and closed in an orthogonal direction to the input and output transmission line.

According to another aspect of the present invention, there is provided a clock extraction device of a receiver including: a dielectric resonator filter extracting a clock signal from the input signal transmitted to a disc type dielectric resonator through an input transmission line on a substrate and comprising a metal cover enclosing the disc type dielectric resonator to form a predetermined volume so as to set a resonator frequency, which is equal to the clock frequency; and a monolithic microwave integrated circuit amplifier directly connected to an output transmission line of the dielectric resonator filter through bonding and amplifying the clock signal.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, the present invention will be described in detail with reference to the attached drawings.

Figure 1:
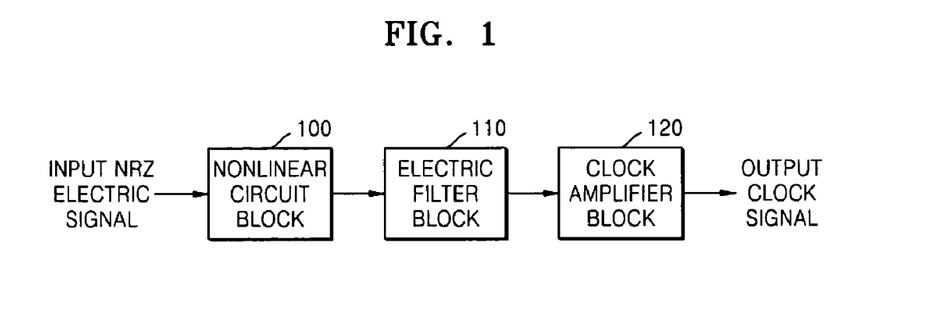
FIG. 1 is a block diagram of a general open-loop type clock extraction device for extracting a clock signal from an NRZ signal.

FIG. 1 is a block diagram of a general open-loop type clock extraction device for extracting a clock signal from an NRZ signal. Referring to FIG. 1, the general open-loop type clock extraction device includes a nonlinear circuit block 100 converting a received NRZ signal into a PRZ signal from which clock information is generated, an electric filter block 110 extracting a clock signal component from the PRZ signal, and a clock amplifier block 120 amplifying the clock signal.

Figure 2:
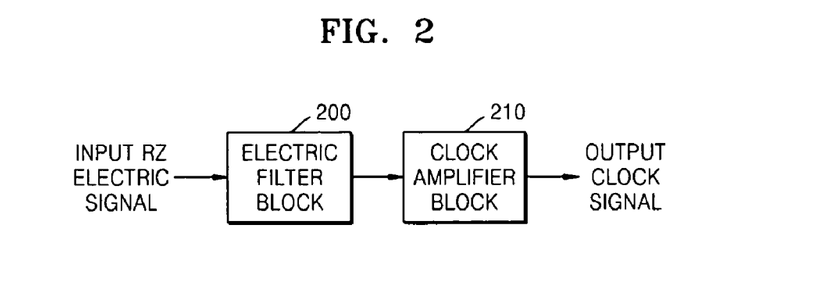
FIG. 2 is a block diagram of a general open-loop type clock extraction device for extracting a clock signal from an RZ signal.

FIG. 2 is a block diagram of a general open-loop type clock extraction device for extracting a clock signal from an RZ signal. Referring to FIG. 2, the general open-loop type clock extraction device includes an electric filter block 200 and a clock amplifier block 210.

Figure 3:
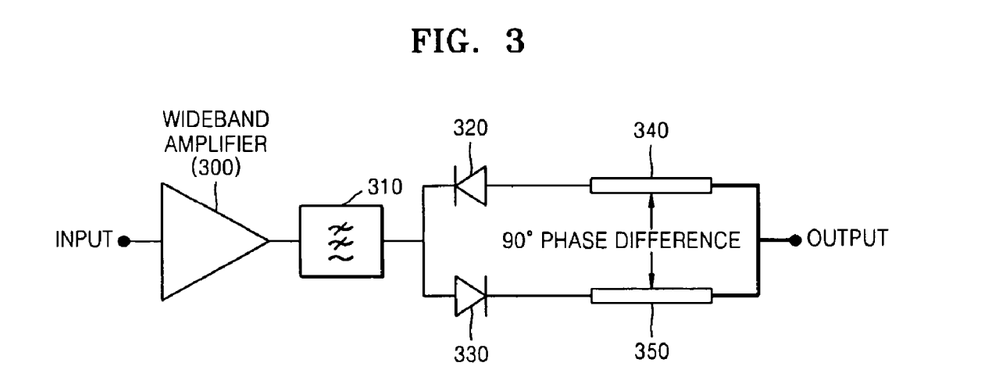
FIG. 3 is a circuit diagram of a nonlinear circuit unit using a pair of diodes and a power combiner having a phase difference of 90°.

FIG. 3 is a circuit diagram of a nonlinear circuit unit using a pair of diodes and a power combiner having a phase difference of 90°. Referring to FIG. 3, the nonlinear circuit unit includes a wide band amplifier 300, a low pass filter (LPF) 310, a pair of diodes 320 and 330, and a power combiner 340 and 350 having a input phase difference of 90°.

Figure 4:
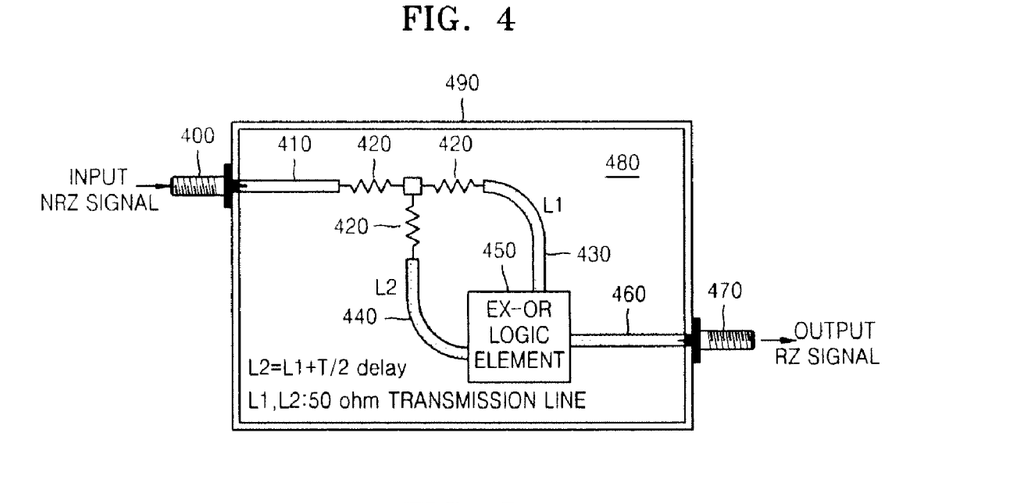
FIG. 4 is a view illustrating a nonlinear circuit unit using an EX-OR and a pair of delay lines having a time difference of T/2.

FIG. 4 is a view illustrating a nonlinear circuit unit using an EX-OR and a pair of delay lines having a time difference of T/2. Referring to FIG. 4, the nonlinear circuit unit includes an input transmission line 410, an output transmission line 460, a power divider using three resistors 420, two transmission lines 430 and 440 having different lengths to make T/2 time difference, and an EX-OR logic device 450.

Figure 5:
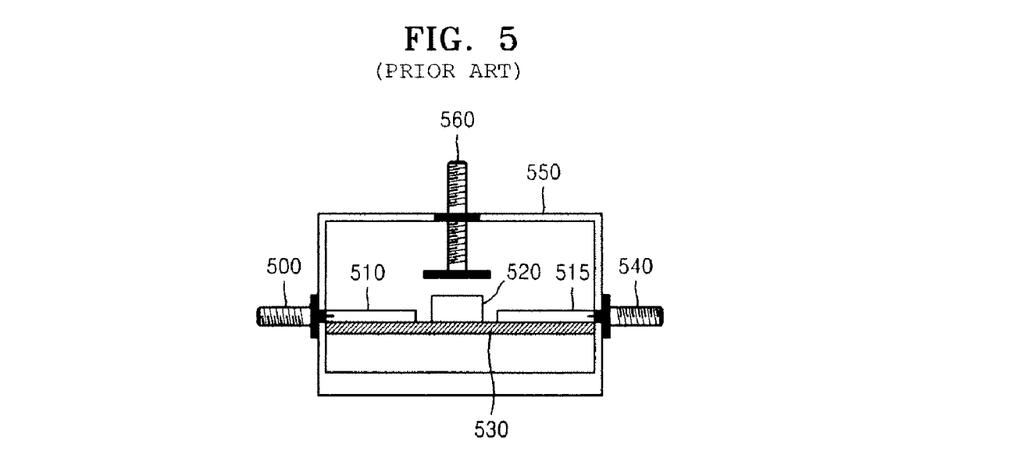
FIG. 5 is a view illustrating a conventional dielectric resonator filter used in an open-loop type clock extraction device.

FIG. 5 is a view illustrating a conventional dielectric resonator filter used in an open-loop type clock extraction device. Referring to FIG. 5, the conventional dielectric resonator filter includes a microwave substrate 530, an input connector 500, an output connector 540, an input transmission line 510, an output transmission line 515, a dielectric resonator 520, a cylindrical metallic module case 550, and a metallic screw 560 for adjusting a resonant frequency. The metallic screw 560 is inserted to easily adjust a resonant frequency of a BPF.

Figure 10:
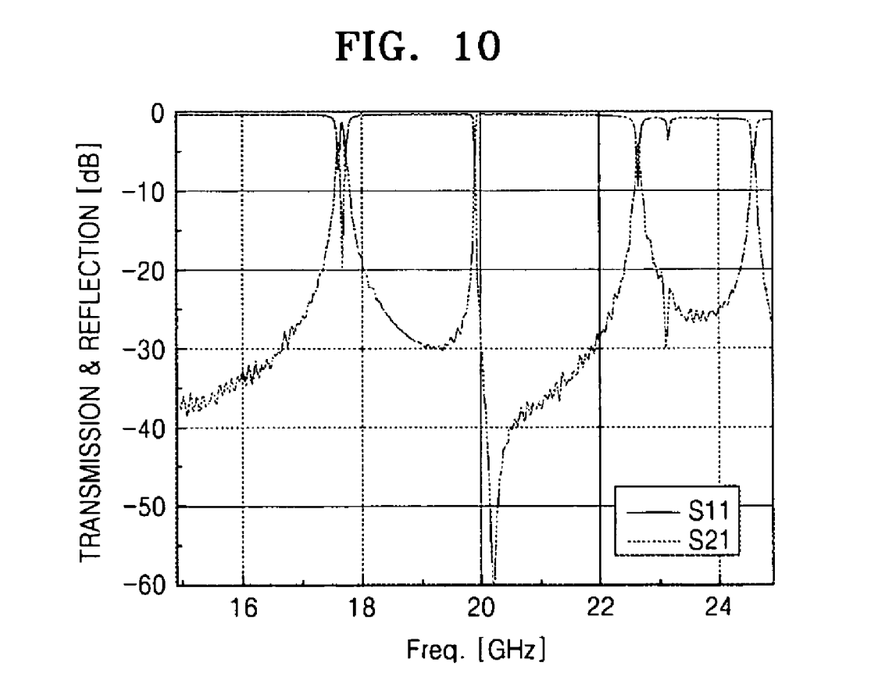
FIG. 10 is a graph illustrating a wide band frequency response characteristic of the conventional dielectric resonator filter of FIG. 5 used in a clock extraction device for the transmission speed of 20 Gb/s.

However, in the conventional dielectric resonator filter shown in FIG. 5, undesired spurious pass bands (17.8 GHz, 22.8 GHz, and 24.7 GHz) exist in the vicinity of a clock frequency of 19.906 GHz of a 20 Gb/s transmission signal as shown with a frequency response characteristic of a 20 GHz band dielectric resonator filter shown in FIG. 10. Thus, in a case where such a conventional dielectric resonator filter is adopted in a clock extraction device, an additional device such as a BPF is required to remove the undesired spurious pass bands.

FIG. 6 is a view illustrating an integrated dielectric resonator filter according to an embodiment of the present invention.

Figure 6A:
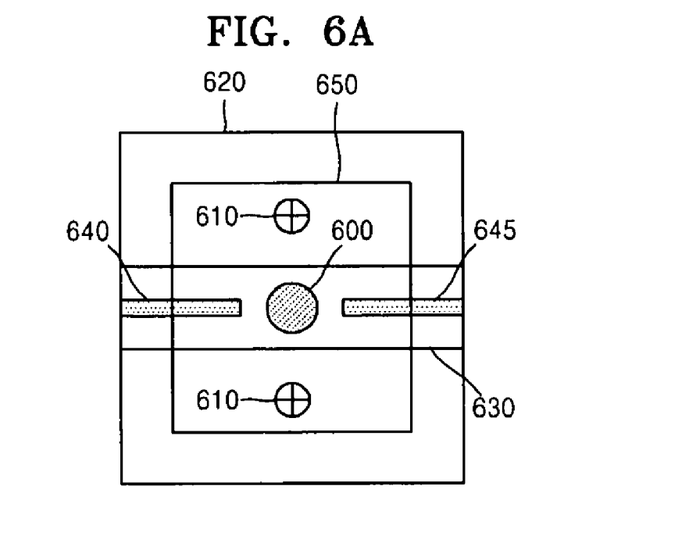
FIG. 6 is a view illustrating an integrated dielectric resonator filter according to an embodiment of the present invention.
Figure 6B:
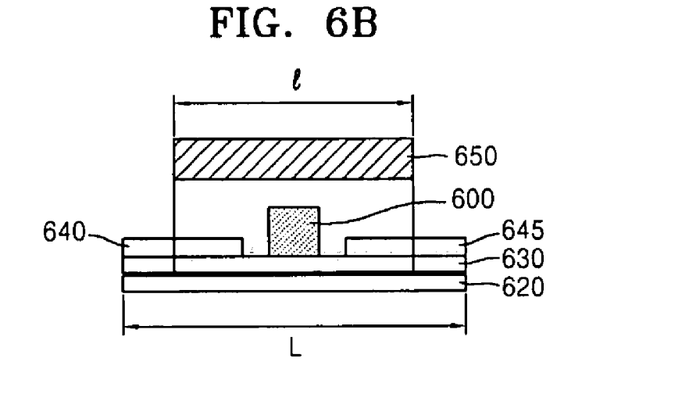
Figure 6C:
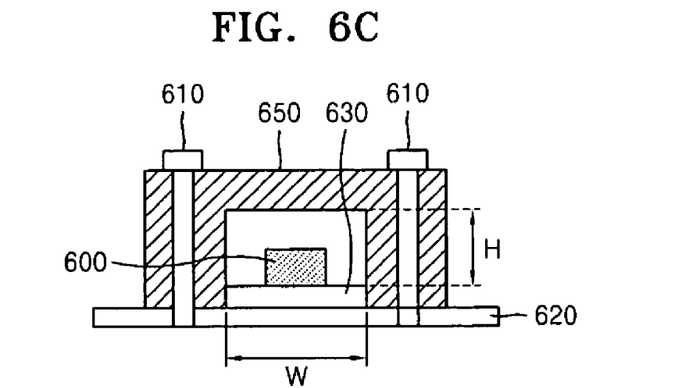

Referring to FIGS. 6A through 6C, the integrated dielectric resonator filter includes a metal plate 620 fixing a metallic cover 650 and a microwave substrate 630, a microwave substrate 630, an input transmission line 640, an output transmission line 645, a disc type dielectric resonator 600, a metallic cover 650, and metallic screws 610 coupling a metallic cover 650 to a plate 620. Physical sizes of a dielectric resonator, a metallic cover, and input and output excitation transmission lines vary with a desired resonant frequency of the bandpass filter. The design values in 40 GHz band will be taken as an example.

The microwave substrate 630 has a dielectric constant of 2.33, a thickness of 0.254 mm, and a width (W) of 2.4 mm as shown in FIG. 6C. The input and output transmission lines 640 and 645 on the microwave substrate 630 are micro-strip transmission lines having a width of 0.37 mm, and a length L (FIG. 6B) of the microwave substrate 630 in a transmission line length direction is 14 mm. The disc type dielectric resonator 600 has a dielectric constant of 30.7, a diameter of 1.6 mm, and a height of 0.64 mm. The metallic cover 650 has an internal height H (FIG. 6C) of 1.65 mm from an upper surface of the microwave substrate 630 and a length l (FIG. 6B) of 8 mm.

A dielectric resonator filter according to the present invention does not include a metallic screw for adjusting the resonant frequency as shown in FIG. 5 because an insertion of the metallic screw deteriorates spurious characteristics. In this integrated dielectric resonator filter, the resonant frequency can be adjusted by adjusting a height of a dielectric resonator or the internal height H of the metal cover 650 from the microwave substrate 630 as shown in FIG. 6C.

Also, a metallic cover according to the present invention has a C-shaped simple structure and thus can be easily fabricated and simply attached and/or detached through coupling screws.

In the present invention, the precise adjustment of a resonant frequency is achieved by reducing a height of a dielectric resonator. The measurement of the resonant frequency of the filter is achieved under condition of installing a metallic cover so as to form the predetermined cavity enclosing the dielectric resonator.

In an integrated dielectric resonator filter according to the present invention, after the input and output transmission lines of this filter is connected to the input and output transmission lines of the other electrical circuit through bonding without a coaxial input and output connector, the resonant frequency of this filter does not vary. Thus, the integrated dielectric resonator filter can be inserted among the other circuit blocks.

Figure 7:
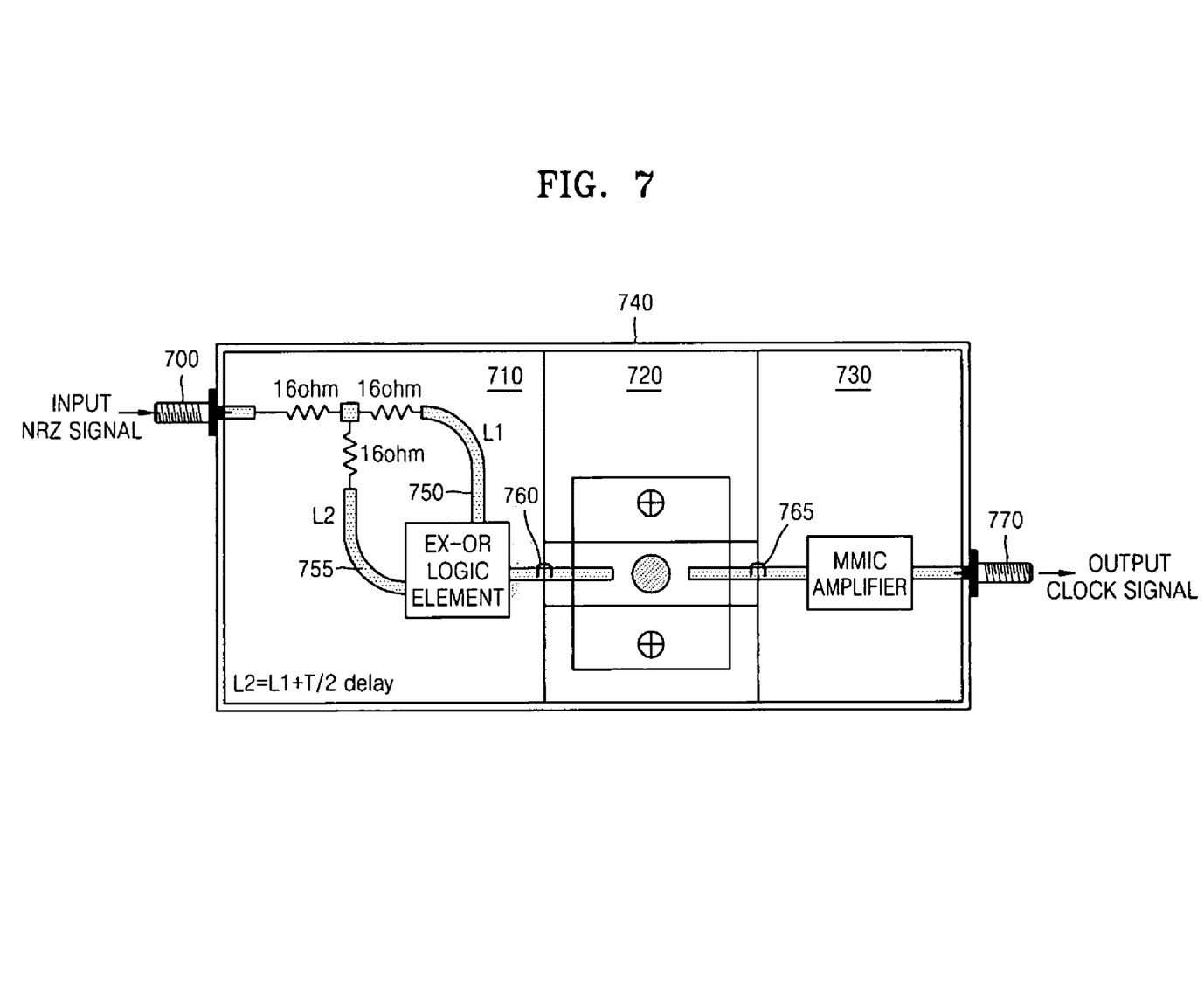
FIG. 7 is a view illustrating a clock extraction device using an integrated dielectric resonator filter according to an embodiment of the present invention.

FIG. 7 is a view illustrating a structure of a clock extraction device using an integrated dielectric resonator filter according to an embodiment of the present invention.

The clock extraction device includes three substrate blocks that are a nonlinear circuit block 710, an electric filter block 720, and a clock amplifier block 730, as shown in FIG. 7. The nonlinear circuit block 710 and the clock amplifier block 730 except the electric filter block 720 may be manufactured using general methods. However, a clock extraction device according to the present invention may include an electric filter block as an integrated dielectric resonator filter. Thus, according to a constituting and manufacturing methods according to the present invention, the total blocks of an open-loop type clock extraction device using a dielectric resonator filter can be integrated into a module package. Finally, the clock extraction device can be manufactured as a compact single module.

FIGS. 8A through 8F are graphs illustrating a process of extracting a 40 GHz clock signal from a 40 Gb/s NRZ signal using the clock extraction device shown in FIG. 7.

Figure 8A:
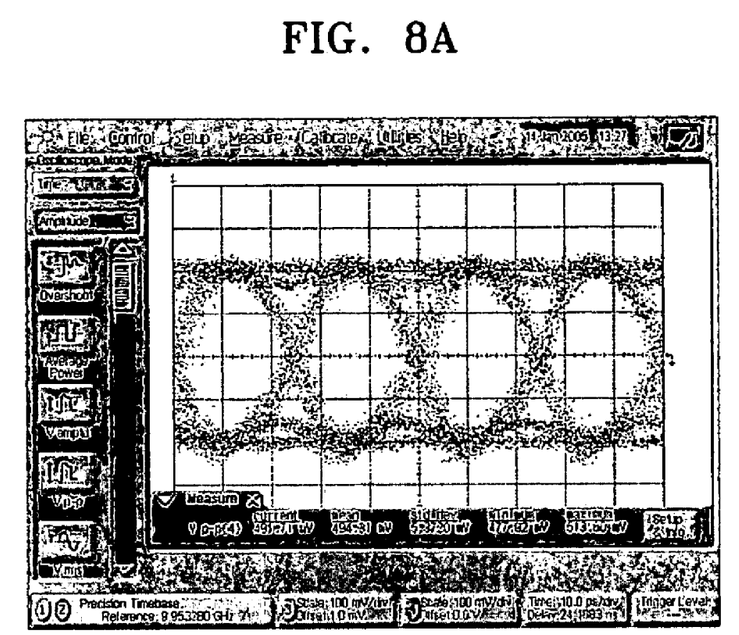
FIGS. 8A through 8F are graphs illustrating a process of extracting a 40 GHz clock signal using a 40 Gb/s clock extraction device shown in FIG. 7.
Figure 8B:
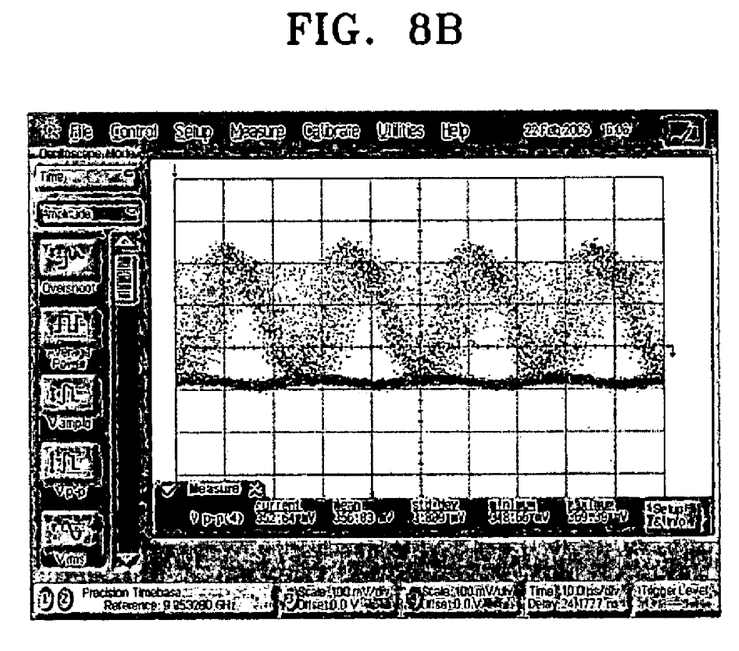

FIG. 8A is a graph illustrating the waveform of an input NRZ electric signal into a 40 Gb/s clock extraction device. A transmission speed of an input signal is accurately 39.81312 Gb/s according to STM-256 standards. FIG. 8B is a graph illustrating the output waveform in the nonlinear circuit block in the 40 Gb/s clock extraction device. As shown in FIG. 8B, the input NRZ signal shown in FIG. 8A is converted into the PRZ signal including the clock signal component.

Figure 8C:
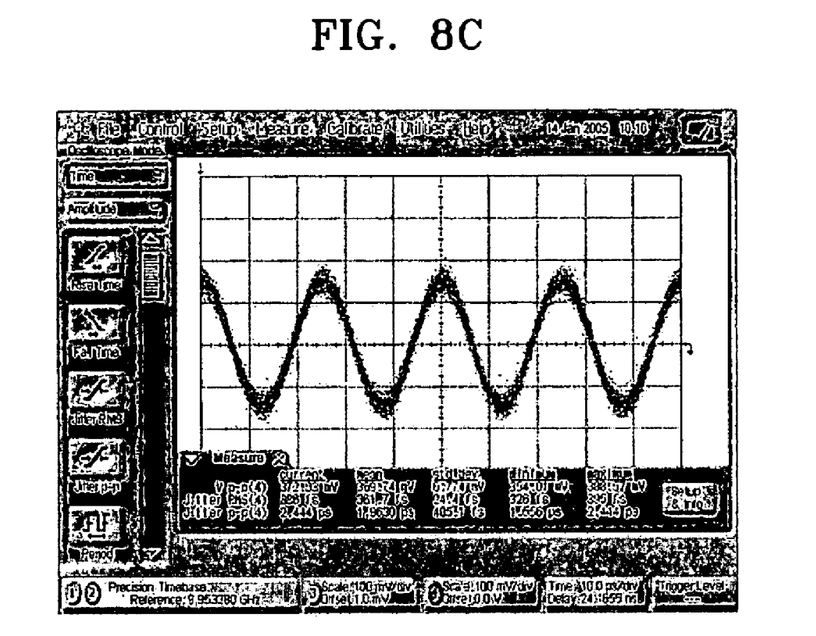
Figure 8D:
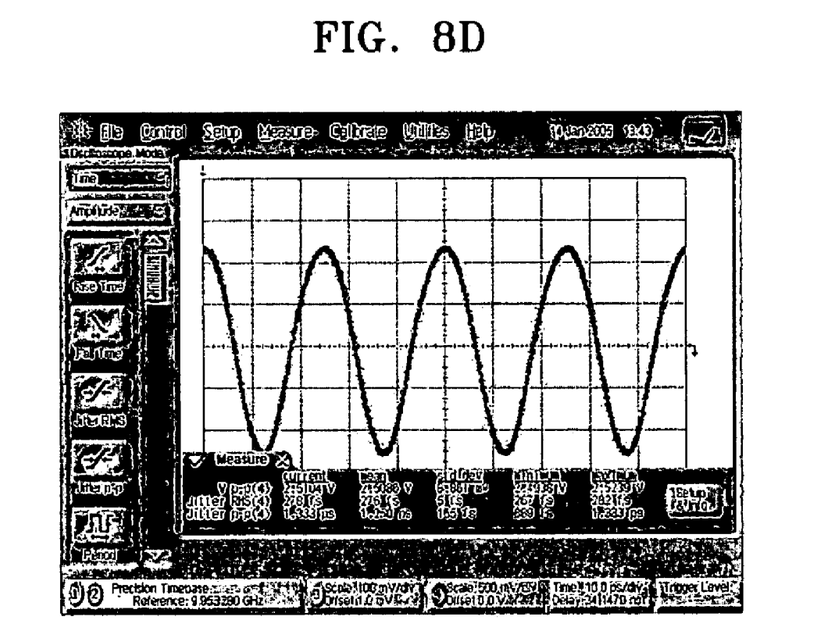

FIG. 8C is a graph illustrating the output waveform of the integrated dielectric resonator filter, i.e., the waveform of a 39.81312 GHz clock signal. FIG. 8D is a graph illustrating the final waveform of the clock signal that is amplified by the MMIC amplifier block, which is followed by the integrated dielectric resonator filter, as shown in FIG. 7. The amplitude of the clock signal is increased from 372 mVpp to 2.5 Vpp through the MMIC amplifier block as compared to the signal of FIG. 8C. The RMS jitter value is decreased from 386 fs(RMS) to 278 fs(RMS).

Figure 8E:
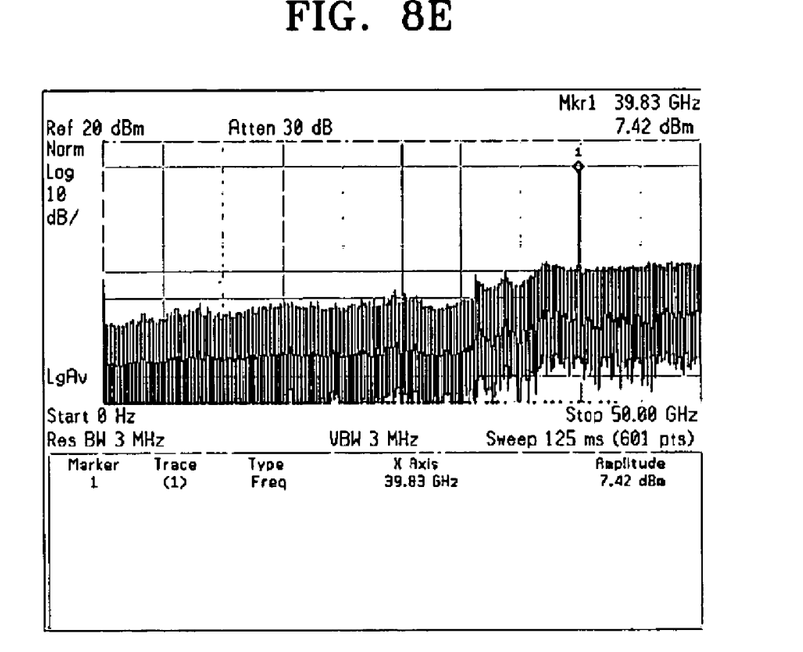
Figure 8F:
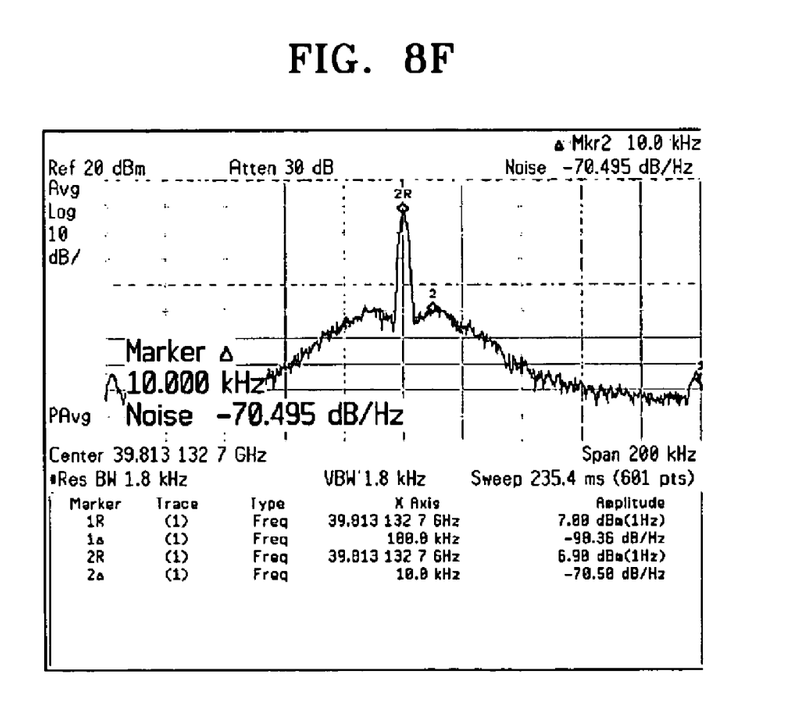

FIGS. 8E and 8F are graphs illustrating the spectrum of the clock signal shown in FIG. 8D. As shown in FIG. 8E, other frequency components except a clock frequency signal do not exist in a wide band. FIG. 8F represents the narrow band spectrum characteristic and means the noise characteristic of the extracted clock signal. The differences between the noise level and the clock component are 70.5 dB and 98.54 dB at a distance of 10 kHz and 100 kHz from the frequency of the clock signal, respectively.

Figure 9:
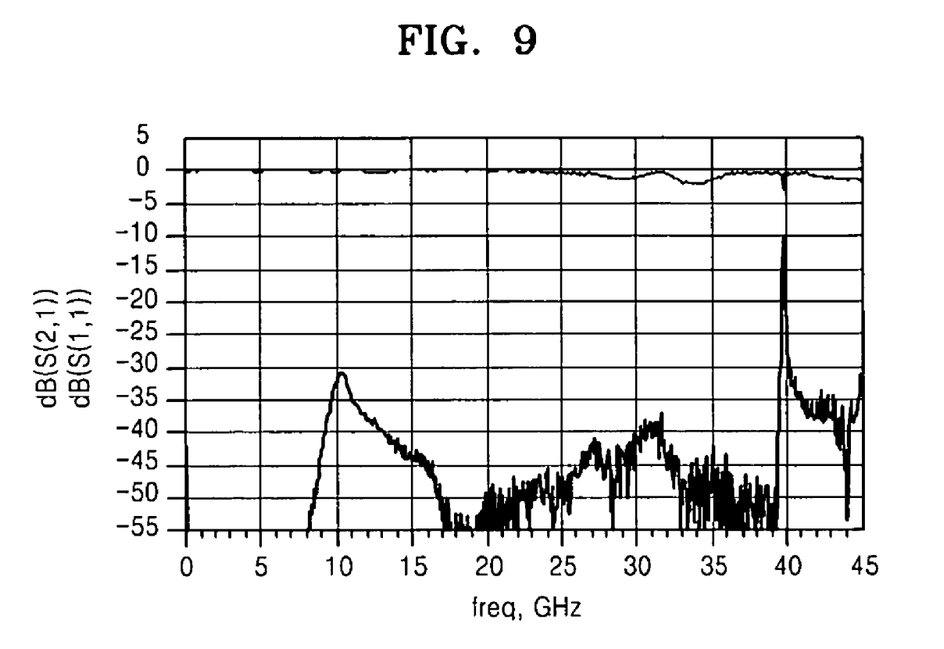
FIG. 9 is a graph illustrating a wide band frequency response characteristic of an integrated dielectric resonator filter adopted in a clock extraction device for the transmission speed of 40 Gb/s according to an embodiment of the present invention.

FIG. 9 is a graph illustrating the wide band frequency response of the integrated dielectric resonator filter used in the 40 Gb/s clock extraction device shown in FIG. 7.

The dielectric resonator filter extracts a clock signal of 39.81312 GHz from a 39.81312 Gb/s transmission signal that is an STM-256 signal. As shown in FIG. 9, any spurious pass band except the clock frequency of 39.81312 GHz does not exist in the vicinity of the center frequency of 39.81312 GHz and in a full wide band of 45 GHz as compared to a graph of FIG. 10.

FIG. 10 is a graph illustrating the wide-band frequency response of the conventional dielectric resonator filter of FIG. 5 used for a 20 Gb/s clock extraction device.

Undesired spurious pass bands of 17.8 GHz, 22.8 GHz, and 24.7 GHz exist in the vicinity of a clock frequency of 19.90656 GHz.

Such spurious pass bands deteriorate the quality of an extracted clock signal. Thus, the clock extraction device requires another filter block removing the spurious pass bands after a dielectric resonator filter. As a result, an open-loop type clock extraction circuit cannot be compact.

Figure 11:
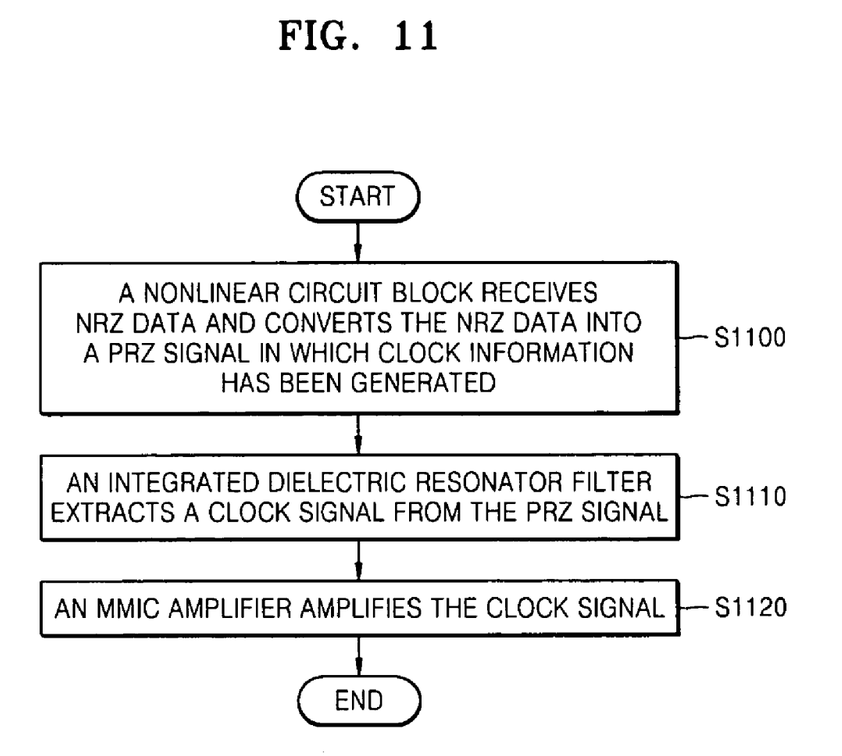
FIG. 11 is a flowchart of an operation of a clock extraction device using an integrated dielectric resonator filter according to an embodiment of the present invention.

FIG. 11 is a flowchart of an operation principle of a clock extraction device using a dielectric resonator filter according to an embodiment of the present invention.

In operation S1100, a nonlinear circuit block receives NRZ data and converts the NRZ data into a PRZ signal from which clock information has been generated. In operation S1110, an integrated dielectric resonator filter extracts a clock signal from the PRZ signal. In operation S1120, an MMIC amplifier amplifies the clock signal extracted from an integrated dielectric resonator filter.

As described above, the open-loop type clock extraction device including a dielectric resonator filter can be integrated into a compact module by applying the integrated dielectric resonator filter with the input and output ports realized by micro-strip transmission lines according to the present invention. Also, the compact clock extraction device is advantageous to a receiver of an ultrahigh optical transmission system. In addition, the signal loss can be minimized due to the decrease of the total signal path in the clock extraction device. Moreover, an additional BPF to remove the spurious pass bands is not required in the present invention.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A dielectric resonator filter comprising:
   a microwave substrate;
   a disc type dielectric resonator installed on the microwave substrate and having predetermined diameter and height;
   an input and output transmission line installed on both sides of the disc type dielectric resonator to transmit input and output signals; and
   a metallic cover enclosing the disc type dielectric resonator to form a predetermined volume, opened toward the input and output transmission line, and closed in an orthogonal direction to the input and output transmission line and wherein the metallic cover forms a predetermined volume to set a resonance frequency of the disc type dielectric resonator.

2. A clock extraction device of a receiver comprising:
   a dielectric resonator filter extracting a clock signal from input data transmitted to a disc type dielectric resonator through an input transmission line on a substrate and comprising a metallic cover enclosing the disc type dielectric resonator to form a predetermined volume so as to set a resonant frequency of the clock signal, the metallic cover opened toward the input transmisson line and an output transmission line of the dielectric resonator filter and closed in an orthogonal direction to the input and output transmission lines; and
   a monolithic microwave integrated circuit amplifier directly connected to the output transmission line of the dielectric resonator filter through bonding and amplifying the clock signal.

3. The clock extraction device of claim 2, further comprising a nonlinear circuit unit directly connected to an input transmission line of the dielectric resonator filter through bonding and converting NRZ data into a PRZ signal from which clock information has been generated.

4. The clock extraction device of claim 2, wherein the dielectric resonator filter comprises a disc type dielectric resonator having a resonant frequency of 40 GHz band.

* * * * *